United States Patent [19]

Sobajima

[11] 3,922,615

[45] Nov. 25, 1975

[54] DIFFERENTIAL AMPLIFIER DEVICE

[75] Inventor: Norio Sobajima, Fuchu, Japan

[73] Assignee: Hitachi, Ltd., Japan

[22] Filed: Oct. 29, 1973

[21] Appl. No.: 410,503

[30] Foreign Application Priority Data

Oct. 27, 1972 Japan .............................. 47-107225

[52] U.S. Cl. ...................... 330/30 D; 330/22; 330/32

[51] Int. Cl.² .............................................. H03F 3/68

[58] Field of Search .......... 330/22, 30 D, 32, 40, 69

[56] References Cited

UNITED STATES PATENTS

| | | | |
|---|---|---|---|
| 3,522,548 | 8/1970 | Heuner et al. | 330/30 D X |
| 3,743,764 | 7/1973 | Wittmann | 330/30 D X |
| 3,781,699 | 12/1973 | Sakamoto | 330/30 D |

*Primary Examiner*—R. V. Rolinec
*Assistant Examiner*—Lawrence J. Dahl
*Attorney, Agent, or Firm*—Craig & Antonelli

[57] ABSTRACT

In a differential amplifier device which includes a plurality of sets each consisting of an emitter-coupled differential amplifier and an emitter follower circuit directly connected on the output side of the differential amplifier, a bias circuit is formed of a transistor, constant-voltage elements connected to the first output electrode of the transistor, the first resistance connected between the first reference potential and an input electrode of the transistor, and the second resistance connected between the input electrode of the transistor and the second reference potential, the first resistance being interposed between the second output electrode and input electrode of the transistor, bias voltages of the differential amplifiers and the emitter follower circuits being derived from portions between the first reference potential and the second resistance, whereby the bias voltage can be arbitrarily set, so that the gain of the differential amplifiers can be arbitrarily set.

9 Claims, 3 Drawing Figures

DIFFERENTIAL AMPLIFIER DEVICE

BACKGROUND OF THE INVENTION

1. Field of the Invention

The present invention relates to differential amplifier devices, and more particularly to a differential amplifier device which includes an emitter-coupled differential amplifier and an emitter follower circuit directly connected on the output side of the differential amplifier.

2. Description of the Prior Art

In the differential amplifier device of this type, in the case where direct-coupled multistage amplification is to be performed using the differential amplifier and the emitter follower circuit as one set, a bias circuit is constituted by combining a control transistor and a plurality of diodes connected in series. The forward voltages of the diodes are employed as the bias voltages of the respective stages.

Such a construction, however, raises a problem as will now be described. The gain of each differential amplifier is determined by the values of the common emitter resistance, the load resistance and the bias voltage. Accordingly, when, in order to achieve a predetermined gain, for example, the number of the diodes connected in series in the bias circuit and the values of the common emitter resistances are selected, the values of the load resistances are also determined.

In the case where it is desired to change the gain of the differential amplifier having such a property and to attain a new desired gain, it is the general practice to change the values of the common emitter resistance and the load resistance. Due to the change of values, however, the balance of the differential amplifier is sometimes lost. Consequently, the desired gain cannot be acquired, and an unbalance distortion arises.

In order to solve the problem stated above, it may be suggested to vary the bias voltage. Since, however, the bias voltage is produced from the forward voltage $V_F$ of the diodes, it can only be integral multiple of the forward voltage $V_F$. The prior-art differential amplifier device has accordingly been incapable of providing arbitrary gains.

SUMMARY OF THE INVENTION

It is therefore the principal object of the present invention to provide a differential amplifier device in which the gain of the differential amplifier can be arbitrarily set.

Another object of the present invention is to provide a differential amplifier device in which the bias voltage can be set at an arbitrary value.

Still another object of the present invention is to provide a differential amplifier device in which, even when the values of the common emitter resistance and load resistance of the differential amplifier are arbitrarily set, the balanced condition of the differential amplifier can be maintained.

A further object of the present invention is to provide a differential amplifier device in which, even when the supply voltage fluctuates, the balance of the differential amplifier is not disturbed.

A yet further object of the present invention is to provide a differential amplifier device which is suitable for fabrication as an integrated semiconductor device.

In order to accomplish such objects, the present invention combines a transistor, a constant-voltage element and resistances to thereby produce arbitrary bias voltages.

PREFERRED EMBODIMENTS OF THE INVENTION

Figures 1, 2, 3:
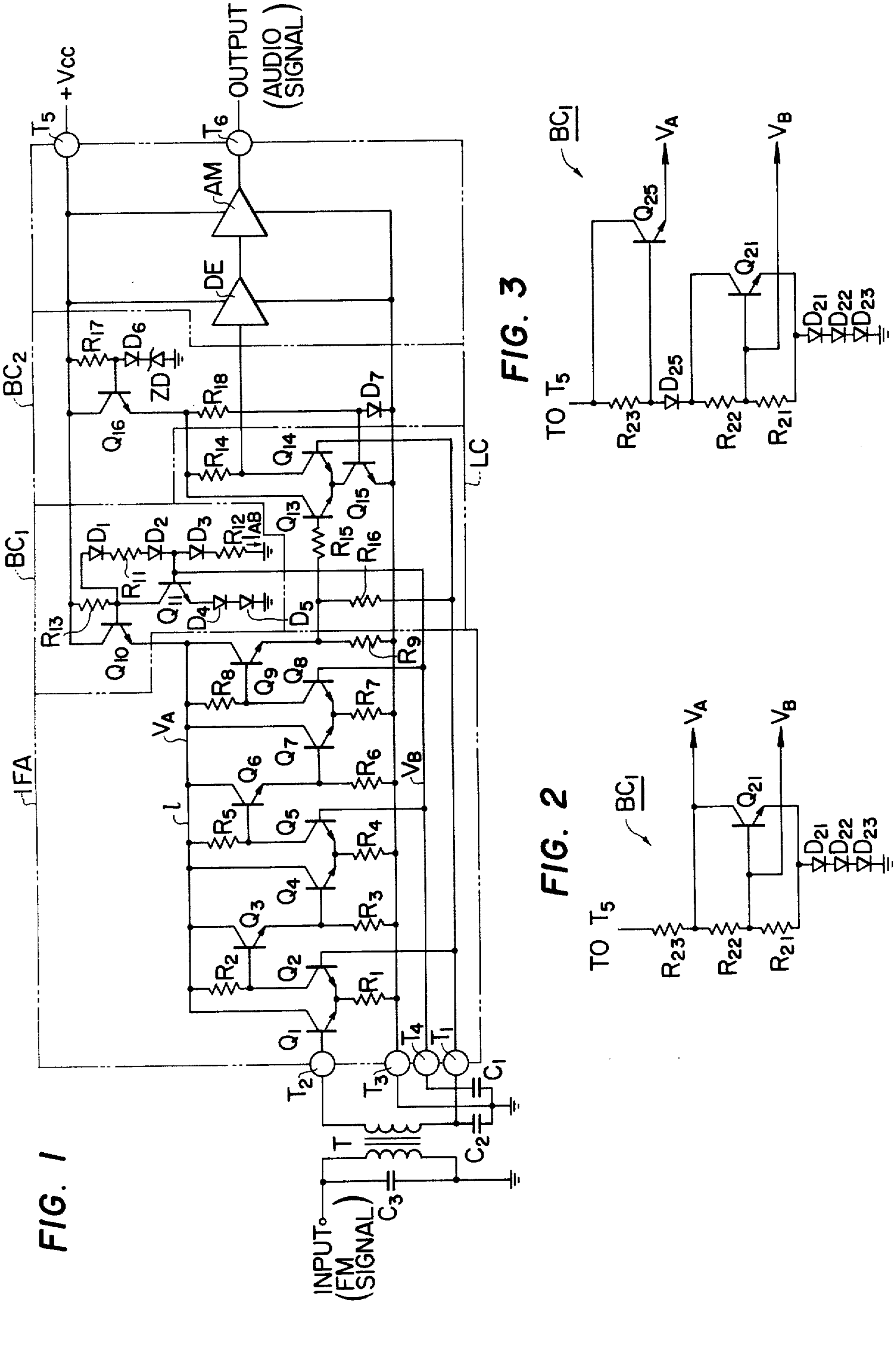
FIG. 1 is a schematic circuit diagram showing an embodiment of the differential amplifier device according to the present invention.
FIGS. 2 and 3 are schematic circuit diagrams each showing a modified embodiment of a bias circuit in the differential amplifier device according to the present invention.

FIG. 1 shows an embodiment of the differential amplifier device according to the present invention, and especially illustrates an FM intermediate-frequency amplifier stage and a detector stage. In the figure, IFA denotes an IF amplifier circuit; $BC_1$ and $BC_2$ are bias circuits; LC is a limiter circuit; DE is an FM detector; AM is an audio-frequency amplifier; and $T_1$ – $T_6$ are terminals.

The IF amplifier circuit IFA is composed of N-P-N transistors $Q_1$ – $Q_9$ and resistances $R_1$ – $R_9$. The transistors $Q_1$ and $Q_2$, $Q_4$ and $Q_5$ and $Q_7$ and $Q_8$ constitute the principal parts of respective differential amplifiers. The pairs of transistors are emitter-coupled, and then connected through common emitter resistances $R_1$, $R_4$ and $R_7$ to the ground terminal $T_3$, respectively. The collectors of the transistors $Q_1$, $Q_4$ and $Q_7$ are directly connected to a power source line *l*. The collectors of the transistors $Q_2$, $Q_5$ and $Q_8$ are connected through the load resistances $R_2$, $R_5$ and $R_8$ to the power source line *l*, and further to the bases of the transistors $Q_3$, $Q_6$ and $Q_9$ constituting the principal parts of emitter follower circuits, respectively. The collectors of the respective transistors $Q_3$, $Q_6$ and $Q_9$ are connected to the power source line *l*, while the emitters are connected through the emitter resistances $R_3$, $R_6$ and $R_9$ to the terminal $T_3$. The emitters of the transistors $Q_3$ and $Q_6$ are also connected to the bases of the transistors $Q_4$ and $Q_7$, respectively.

The bias circuit $BC_1$ is composed of N-P-N transistors $Q_{10}$ and $Q_{11}$, diodes $D_1$ – $D_5$ and resistances $R_{11}$ – $R_{13}$. Two of the diodes $D_4$ and $D_5$ are connected in the forward direction and in series between the emitter of the transistor $Q_{11}$ and ground, while the diode $D_3$ and the resistance $R_{12}$ are connected in series between the base of the transistor $Q_{11}$ and ground. Between the collector and base of the transistor $Q_{11}$, the diodes $D_1$ and $D_2$ and the resistance $R_{11}$ are connected in series. As to the transistor $Q_{10}$, the base is connected to the collector of the transistor $Q_{11}$, the resistance $R_{13}$ is connected between the collector and base, and the emitter is connected to the power source line *l* of the IF amplifier circuit IFA.

The collector of the transistor $Q_{10}$ is connected to the power supply terminal $T_5$. The diodes $D_1$, $D_2$ and $D_3$ arranged on the base side of the transistor $Q_{11}$ are connected in the forward direction with respect to the power supply $+V_{cc}$. The base of the transistor $Q_{11}$ is connected to the bases of the transistors $Q_2$, $Q_5$ and $Q_8$ of the IF amplifier circuit and to the terminal $T_4$.

The limiter circuit LC is composed of N-P-N transistors $Q_{13}$ – $Q_{15}$ and resistances $R_{14}$ – $R_{16}$. The transistors $Q_{13}$ and $Q_{14}$ are emitter-coupled. The base of the transistor $Q_{13}$ is connected through the resistance $R_{15}$ to the emitter of the transistor $Q_9$ of the IF amplifier circuit IFA, and is further connected through both the resistances $R_{15}$ and $R_{16}$ to the terminal $T_1$ and to the base of the transistor $Q_{14}$. The collector of the transistor $Q_{14}$ is connected through the resistance $R_{14}$ to the collector of the transistor $Q_{13}$, and is further connected to the FM detector DE. The collector of the transistor $Q_{15}$ is connected to the emitters of the transistors $Q_{13}$ and $Q_{14}$, while the emitter of the transistor $Q_{15}$ is connected to the terminal $T_3$. The resistance $R_{16}$ is provided for the DC feedback to the base of the transistor $Q_2$ of the IF amplifier circuit IFA.

The bias circuit $BC_2$ is provided for the limiter LC, and is composed of a transistor $Q_{16}$, resistances $R_{17}$ and $R_{18}$, diodes $D_6$ and $D_7$ and a Zener diode ZD. The collector of the transistor $Q_{16}$ is connected to the terminal $T_5$, while the emitter is directly connected to the collector of the transistor $Q_{13}$ of the limiter circuit LC. The emitter of the transistor $Q_{16}$ is also connected through the resistance $R_{18}$ and the diode $D_7$ to the terminal $T_3$. To the juncture between the resistance $R_{18}$ and the diode $D_7$, there is connected the base of the transistor $Q_{15}$ of the limiter circuit LC. The diode $D_6$ and the Zener diode ZD are connected in series between the base of the transistor $Q_{16}$ and ground, while the resistance $R_{17}$ is connected between the base of the transistor $Q_{16}$ and the terminal $T_5$.

The FM detector DE is connected through the audiofrequency amplifier AM to the terminal $T_6$.

The foregoing circuitry within the broken lines in FIG. 1 is constructed of an integrated circuit, and is connected through the terminals $T_1 - T_8$ to external circuits. In the illustrated embodiment, the power supply $+V_{cc}$ is connected to the terminal $T_5$, while the terminal $T_3$ is grounded. Between the terminal $T_4$ and ground, a capacitor $C_1$ is connected. A capacitor $C_2$ is connected between the terminal $T_1$ and ground, while the secondary winding of a transformer T is connected between the terminals $T_1$ and $T_2$. In parallel with the primary winding of the transformer T, a capacitor $C_3$ is connected, one terminal of which is grounded and the other terminal of which receives an input signal.

With such a construction, the bias voltage $V_A$ of the power source line $l$ of the IF amplifier circuit IFA and the base bias voltage $V_B$ of the transistors $Q_5$ and $Q_8$ are determined as below.

The base bias voltage $V_B$ of the transistors $Q_5$ and $Q_8$ is derived from the base of the transistor $Q_{11}$ of the bias circuit $BC_1$. The voltage $V_B$ is fixed to 3V which is 2 $V_F$ of the forward voltages of the diodes $D_4$ and $D_5$ and the base-emitter forward voltage $V_F$ of the transistor $Q_{11}$.

Since the base voltage of the transistor $Q_{11}$ is 3 $V_F$, the current $I_{AB}$ flowing through the diodes $D_1$ to $D_3$ and the resistances $R_{11}$ and $R_{12}$ is represented by 2 $V_F/R_{12}$ (because $V_F + I_{AB} \cdot R_{12} = 3\ V_F$). Accordingly, the collector voltage of the transistor $Q_{11}$ is represented by $$5\ V_F + \frac{R_{11}}{R_{12}} 2\ V_F = 3\ V_F + (2\ V_F + I_{AB} \cdot R_{11}).$$

Therefore, the bias voltage $V_A$ of the power source line $l$ is fixed to $$4\ V_F + \frac{R_{11}}{R_{12}} \cdot 2\ V_F = 5\ V_F + \frac{R_{11}}{R_{12}} 2\ V_F - V_F$$

(the base-emitter forward voltage of the transistor $Q_{10}$).

Consequently, even when the values of the common emitter resistances $R_1$, $R_4$ and $R_7$ and the load resistances $R_2$, $R_5$ and $R_8$ of the respective differential amplifiers are changed in order to vary the gains thereof, the bias voltage $V_A$ can be adjusted to an arbitrary value by varying the values of the resistances $R_{11}$ and $R_{12}$ of the bias circuit $BC_1$. Arbitrary gains can therefore be attained. In particular, currents flowing through the load resistances $R_2$, $R_5$ and $R_8$ of the respective differential amplifiers can be adjusted by varying the values of the resistances $R_{11}$ and $R_{12}$ of the bias circuit $BC_1$, so that even if the values of the common emitter resistances $R_1$, $R_4$ and $R_7$ and the load resistances $R_2$, $R_5$ and $R_8$ are changed, the balanced condition of the differential amplifiers can be maintained.

With a bias circuit $BC_1$ of such construction, the current $I_{AB}$ flowing through the diodes $D_1$ to $D_3$ and the resistances $R_{11}$ and $R_{12}$ is expressed by 2 $V_F/R_{12}$, and hence, it is a constant current. Accordingly, even when the supply voltage $+V_{cc}$ fluctuates, the bias voltages $V_A$ and $V_B$ do not change.

The biases of the differential amplifiers are determined by the values of the common emitter resistances $R_4$ and $R_7$ as well as the load resistances $R_5$ and $R_8$ and the bias voltages $V_A$ and $V_B$. Even if the values of the respective resistances and the forward voltages of the respective diodes are dispersed, the balance of the differential amplifiers is determined by the relative ratios between the common emitter resistances and the resistance $R_{12}$ and between the load resistances and the resistance $R_{11}$. In an integrated semiconductor circuit, the relative ratios between the resistances contain comparatively small dispersions. For these reasons, if the present invention is applied to an integrated semiconductor circuit, the dispersion in the balance of the differential amplifiers becomes small.

FIG. 2 shows another embodiment of the differential amplifier device according to the present invention, and especially illustrates only the bias circuit $BC_1$. In the figure, $Q_{21}$ designates an N-P-N transistor, $D_{21} - D_{23}$ are diodes, and $R_{21} - R_{23}$ are resistances. The base of the transistor $Q_{21}$ is connected through the resistance $R_{21}$ to the emitter of its own transistor, and is further connected through the resistance $R_{22}$ to its own collector. Between the emitter of the transistor $Q_{21}$ and ground, the diodes $D_{21} - D_{23}$ are connected in series in the forward direction. The collector of the transistor $Q_{21}$ is also connected through the resistance $R_{23}$ to the terminal $T_5$. The bias voltage $V_B$ is derived from the base of the transistor $Q_{21}$, while the bias voltage $V_A$ is derived from the collector thereof.

With such a construction, the bias voltage $V_B$ becomes 4 $V_F$ (the forward voltages of the diodes and the base-emitter forward voltage of the transistor), while the bias voltage $V_A$ becomes $$4\ V_F + \frac{R_{22}}{R_{21}} V_F$$

(the base bias voltage $V_B$ and the voltage drop across $R_{22}$). Accordingly, as in the embodiment in FIG. 1, the bias voltage $V_A$ can be adjusted to arbitrary value, and the gains of the differential amplifers can be arbitrarily varied.

FIG. 3 shows a further modification of the bias circuit $BC_1$ of FIG. 2. A point of difference from the embodiment in FIG. 2 is that the bias voltage $V_A$ is obtained through a transistor $Q_{25}$. In this case, the transistor $Q_{25}$ has its collector connected to the terminal $T_5$, and has its base connected to one end of the resistance $R_{23}$. Between the resistances $R_{23}$ and $R_{22}$, a diode $D_{25}$ is interposed. The bias voltage $V_A$ is derived from the emitter of the transistor $Q_{25}$.

With such a construction, it is possible to avoid the possibility, in the bias circuit in FIG. 2, that a current directly flows from the terminal $T_5$ through the resistance $R_{23}$ towards the IF amplifier circuit, with the result that a fluctuation in the supply voltage appears in the form of a change in the bias voltage $V_A$ of the IF amplifier circuit.

The diode $D_{25}$ is employed in order to produce the same voltage as the bias voltage $V_A$ in FIG. 2.

Although, in the foregoing embodiments, the differential amplifier device is applied to the FM intermediate-frequency amplifier stage, it may of course be applied to a TV voice intermediate-frequency amplifier stage. More generally, insofar as a differential amplifier device including as one set a differential amplifier and an emitter follower circuit connected on the output side thereof is concerned, the present invention is applicable similarly to the foregoing embodiments.

Although, in the embodiments, the N-P-N transistors are employed for the bias circuits $BC_1$, they may be replaced with P-N-P transistors in dependence on the polarity of the supply voltage of an apparatus to be used or on any other condition.

Although, in the embodiments, the diodes are employed as constant-voltage elements with notice taken of the fact that their forward voltage $V_F$ is constant, they may of course be replaced with other elements having the same characteristics.

Although, in the embodiments, the bias voltage $V_B$ to be supplied to the bases of the transistors $Q_5$ and $Q_8$ of the IF amplifier circuit IFA is derived from the base of the transistor $Q_{11}$ (or $Q_{21}$) of the bias circuit $BC_1$, it may of course be obtained from any other constant-voltage source.

As described above, in accordance with the differential amplifier device of the present invention, the bias voltage $V_A$ can be set at an arbitrary value, so that the gains of the differential amplifiers can be arbitrarily set. Furthermore, in accordance with the present invention, even when the values of the common emitter resistances and the load resistances of the differential amplifiers are arbitrarily set, the bias voltages can be arbitrarily varied according to the selected values, so that the balanced condition of the differential amplifiers can be maintained.

In accordance with the present invention, even if the values of the respective elements constituting the bias circuit have dispersions, the balance of the differential amplifiers is little dispersed because it is determined by the relative ratios between the resistances of the differential amplifiers and the bias circuit. Since the dispersions in the relative ratios are comparatively small in integrated semiconductor circuits, the invention is very effective when applied to the technology of integrated semiconductor circuits.

With the bias circuit of the circuit arrangement in FIG. 1 or FIG. 3, the bias voltages $V_A$ and $V_B$ are not changed even by fluctuations in the supply voltage, so that the balance of the differential amplifiers is not disturbed.

While I have shown and described several embodiments in accordance with the present invention, it is understood that the same is not limited thereto but is susceptible of numerous changes and modifications as known to those skilled in the art and I therefore do not wish to be limited to the details shown and described herein but intend to cover all such changes and modifications as are obvious to one of ordinary skill in the art.

What I claim is:

1. In a differential amplifier device including at least one emitter-coupled differential amplifier, and at least one emitter follower circuit directly connected on the output side of the differential amplifier, a bias circuit comprising a first transistor which has an input electrode and first and second output electrodes, at least one constant-voltage element connected between said first output electrode of said transistor and a source of second reference potential, a first resistance connected between a source of first reference potential and said input electrode of said transistor and a second resistance connected between said input electrode of said transistor and said source of second reference potential, said second output electrode of said transistor being connected to said input electrode thereof through said first resistance, an input of said differential amplifier being connected to the point between said first resistance and said second resistance to obtain a bias voltage therefrom.

2. The combination defined in claim 1, wherein said differential amplifier and said emitter follower circuit are connected to said source of first reference potential.

3. The combination defined in claim 2, wherein said source of first reference potential is a third resistance connecting a d.c. source to said first resistance.

4. The combination defined in claim 2, wherein said source of first reference potential comprises a third resistance connecting a d.c. source to said first resistance, and a second transistor having an input electrode connected to the second output electrode of said first transistor, a first output electrode connected to said d.c. source and a second output electrode connected to said differential amplifier and said emitter follower circuit.

5. The combination defined in claim 4, wherein a diode connects said third resistance to said first resistance and said input electrode of said second transistor to the second output electrode of the other transistor.

6. The combination defined in claim 1, wherein said constant voltage element comprises a plurality of diodes in series.

7. The combination defined in claim 6, wherein at least one diode is connected in series with said first resistance between said second output electrode of said first transistor and the input electrode thereof.

8. The combination defined in claim 7, wherein at least one additional diode is connected in series with said second resistance between said input electrode of said first transistor and said source of second reference potential.

9. In a differential amplifier device including at least one emitter-coupled differential amplifier, and at least one emitter follower circuit directly connected on the output side of the differential amplifier, a bias circuit comprising a first transistor which has a base electrode, an emitter electrode and a collector electrode; at least one constant-voltage element connected between said emitter electrode and a source of second reference potential; a first resistance connected between a source of first reference potential and said base electrode; a second resistance connected directly between said base electrode and said emitter electrode; means for connecting said collector electrode to said base electrode through said first resistance; and means for connecting an input of said differential amplifier to the point between said first resistance and said second resistance to obtain a bias voltage therefrom.

* * * * *